(12) United States Patent
Godyak

(10) Patent No.: US 8,992,725 B2
(45) Date of Patent: Mar. 31, 2015

(54) PLASMA REACTOR WITH INDUCTIE EXCITATION OF PLASMA AND EFFICIENT REMOVAL OF HEAT FROM THE EXCITATION COIL

(75) Inventor: Valery Godyak, Brookline, MA (US)

(73) Assignee: Mattson Technology, Inc., Fremont, CA (US)

( * ) Notice: Subject to any disclaimer, the term of this patent is extended or adjusted under 35 U.S.C. 154(b) by 1908 days.

(21) Appl. No.: 11/894,832

(22) Filed: Aug. 23, 2007

(65) Prior Publication Data

US 2008/0050292 A1   Feb. 28, 2008

Related U.S. Application Data

(60) Provisional application No. 60/840,262, filed on Aug. 28, 2006.

(51) Int. Cl.
*C23C 16/00* (2006.01)
*H01L 21/306* (2006.01)
(Continued)

(52) U.S. Cl.
CPC ............... *H05H 1/46* (2013.01); *H01J 37/321* (2013.01); *H01J 37/3255* (2013.01); *H01J 37/32724* (2013.01)
USPC .............. 156/345.48; 118/723 AN; 118/723 I

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ....... 118/723 I, 723 IR, 723 AN; 156/345.48, 156/345.49; 315/111.51
See application file for complete search history.

(56) References Cited

U.S. PATENT DOCUMENTS

| 5,234,529 A | 8/1993 | Johnson |
| 5,304,282 A | 4/1994 | Flamm |

(Continued)

FOREIGN PATENT DOCUMENTS

| EP | 0908923 A2 | 4/1999 |
| EP | 1662546 A1 | 5/2006 |

(Continued)

OTHER PUBLICATIONS

An article published by M. A. Lieberman and A. J. Lichtenberg, in "Principles of Plasma Discharges and Materials Processing", John Wiley & Sons, Inc, New York, 1994 that describes inductive plasma reactors, their structure and application for plasma processing of semiconductor chips and large panel displays.

(Continued)

*Primary Examiner* — Luz Alejandro Mulero
(74) *Attorney, Agent, or Firm* — Dority & Manning, P.A.

(57) ABSTRACT

The plasma reactor of the invention is intended for treating the surfaces of objects such as semiconductor wafers and large display panels, or the like, with plasma. The main part of the plasma reactor is an array of RF antenna cells, which are deeply immersed into the interior of the working chamber. Each antenna cell has a ferromagnetic core with a heat conductor and a coil wound onto the core. The core and coil are sealed in the protective cap. Deep immersion of the antenna cells having the structure of the invention provides high efficiency of plasma excitation, while the arrangement of the plasma cells and possibility of their individual adjustment provide high uniformity of plasma distribution and possibility of adjusting plasma parameters, such as plasma density, in a wide range.

13 Claims, 7 Drawing Sheets

(51) Int. Cl.
*H05H 1/46* (2006.01)
*H01J 37/32* (2006.01)

(56) References Cited

U.S. PATENT DOCUMENTS

| | | | |
|---|---|---|---|
| 5,309,063 A | | 5/1994 | Singh |
| 5,401,350 A | | 3/1995 | Patrick et al. |
| 5,464,476 A | | 11/1995 | Gibb et al. |
| 5,571,366 A | | 11/1996 | Ishii et al. |
| 5,653,811 A | | 8/1997 | Chan |
| 5,711,849 A | | 1/1998 | Flamm et al. |
| 5,811,022 A | | 9/1998 | Savas |
| 5,888,414 A | | 3/1999 | Collins et al. |
| 5,907,221 A | * | 5/1999 | Sato et al. ............ 315/111.51 |
| 5,939,886 A | | 8/1999 | Turner et al. |
| 5,965,034 A | | 10/1999 | Vinogradov |
| 5,980,766 A | | 11/1999 | Flamm et al. |
| 5,994,236 A | | 11/1999 | Ogle |
| 6,017,221 A | | 1/2000 | Flamm |
| 6,033,481 A | | 3/2000 | Yokogawa et al. |
| 6,056,848 A | | 5/2000 | Daviet |
| 6,080,271 A | | 6/2000 | Fujii |
| 6,127,275 A | | 10/2000 | Flamm |
| 6,178,920 B1 | * | 1/2001 | Ye et al. ............... 118/723 I |
| 6,204,607 B1 | | 3/2001 | Ellingboe |
| 6,231,776 B1 | | 5/2001 | Flamm |
| 6,259,209 B1 | | 7/2001 | Bhardwaj et al. |
| 6,267,074 B1 | | 7/2001 | Okumura |
| 6,270,687 B1 | | 8/2001 | Ye et al. |
| 6,291,793 B1 | | 9/2001 | Qian et al. |
| 6,321,681 B1 | | 11/2001 | Colpo et al. |
| 6,322,661 B1 | | 11/2001 | Bailey, III et al. |
| 6,380,680 B1 | | 4/2002 | Troxler |
| 6,417,626 B1 | | 7/2002 | Brcka et al. |
| 6,451,161 B1 | | 9/2002 | Jeng et al. |
| 6,516,742 B1 | | 2/2003 | Blalock et al. |
| 6,534,922 B2 | * | 3/2003 | Bhardwaj et al. ....... 315/111.51 |
| 6,572,732 B2 | | 6/2003 | Collins |
| 6,632,324 B2 | | 10/2003 | Chan |
| 6,649,223 B2 | | 11/2003 | Colpo et al. |
| 6,682,630 B1 | | 1/2004 | Colpo et al. |
| 6,790,311 B2 | | 9/2004 | Collins et al. |
| 6,858,112 B2 | | 2/2005 | Flamm et al. |
| 7,005,845 B1 | | 2/2006 | Gonzalez et al. |
| 7,018,506 B2 | | 3/2006 | Hongoh et al. |
| 7,137,444 B2 | | 11/2006 | Faybishenko et al. |
| 2003/0076020 A1 | * | 4/2003 | Anami et al. ................ 313/35 |
| 2003/0192644 A1 | | 10/2003 | Pu et al. |
| 2004/0060517 A1 | | 4/2004 | Vukovic et al. |
| 2004/0163766 A1 | | 8/2004 | Kanarov et al. |
| 2008/0050537 A1 | | 2/2008 | Godyak |
| 2010/0136262 A1 | | 6/2010 | Godyak |

FOREIGN PATENT DOCUMENTS

| | | |
|---|---|---|
| JP | 10083896 A | 3/1998 |
| KR | 2008-0028848 A | 4/2008 |
| WO | 2002/084700 A1 | 10/2002 |
| WO | 2005/057607 A2 | 6/2005 |

OTHER PUBLICATIONS

Deguchi et al. Effects of Antenna Size and Configurations in Large-Area RF Plasma Production with Internal Low-Inductance Antenna Units. in [Jpn. J. Appl. Phys. 45, 8042 (2007)].

Design of a magnetic-pole enhanced inductively coupled plasma source, T Meziani, P. Colpo and F. Rossi, Plasma Sources Science and Technology pp. 276-283, Dec. 12, 2000, final form Mar. 29, 2001.

European Search Report and Written Opinion for International Application No. PCT/US/07/18717, Mar. 4, 2008.

Fluxtrol Materials Characteristics, Fluxtrol Company materials datasheet, 2008.

* cited by examiner

PLASMA REACTOR WITH INDUCTIE EXCITATION OF PLASMA AND EFFICIENT REMOVAL OF HEAT FROM THE EXCITATION COIL

FIELD OF THE INVENTION

The present invention is related to a plasma reactor with inductive excitation of plasma for plasma processing of various objects such as semiconductor materials and large panel displays by etching, coating, activating, or otherwise treating surfaces of various parts by means of plasma. The plasma reactor of the invention has advantage of efficient removal of heat from the excitation coil, high energetic efficiency of plasma generation, which is free of capacitive coupling, high power transfer efficiency, and effective plasma uniformity control.

BACKGROUND OF THE INVENTION

Inductive plasma reactors, which typically consist of reactor chambers and inductively coupled plasma (ICP) sources, are commonly recognized as advanced, convenient, and cost-effective devices for plasma processing of parts and materials at various stages of large-scale manufacturing, e.g., of semiconductor chips and large panel displays. Such sources are also used for activating gases needed for cleaning plasma-processing chambers and for incineration (abatement) of harmful plasma processing gases, [see: M. A. Lieberman and A. J. Lichtenberg, "Principles of Plasma Discharges and Materials Processing", John Wiley & Sons, Inc, New York, 1994]. Application of inductive discharges has an advantage of achieving high-density plasma in a wide range of gas pressures with efficient energy transfer to the plasma electrons rather than to the plasma ions as is typical of capacitively coupled RF discharges.

A typical ICP reactor for large area uniform plasma processing of 300 mm wafers and flat panel displays comprises a cylindrical metal chamber filled with working gas and having a dielectric (quartz or ceramic) flat, dome-shape, or cylindrical window separating an inductor coil plasma source from the plasma in the working chamber where an object, e.g., a semiconductor wafer, is located for treatment. The operation of this ICP (as of any inductive discharge) is based on the principle of electromagnetic induction. The RF current driven in the inductor coil induces an electromagnetic RF field and RF plasma current in the activated gas of the working chamber, thus maintaining the plasma discharge inside the chamber. As any inductive RF discharge, an ICP source can be considered as an electrical transformer where the inductor coil connected to an RF source is an actual primary winding and the plasma is a single closed turn of a virtual secondary winding.

An ICP antenna loaded with plasma has mainly inductive impedance (reactance) that has to be compensated with matching-tuning network (matcher) for impedance matching conditions required for efficient transfer of RF power from an RF generator to the plasma-excitation antenna of the plasma source. The matcher is connected to the coil with a conductor conduit bearing a large resonant RF current, thus distorting axial symmetry of electromagnetic field distribution created by the ICP antenna. Asymmetry of the RF field results in plasma azimuthal asymmetry and non-uniformity of treatment. When the length of the conductor becomes comparable to the coil length, the asymmetry effect caused by the conduit becomes large, especially for large ICP reactors used for treating 300 mm wafers, the plasma-excitation coils of which have a low number of turns, and, hence, low inductance. On the other hand, matching of the coil having low inductance with a standard resonance matching network becomes energy inefficient due to extra-large RF current and thus high power losses in the matcher network and in the coil itself.

A common problem that occurs in industrial ICP reactors for plasma processing results from a high RF voltage (a few kV) between the terminals of the inductor coil (antenna). High antenna RF voltage requires special means for adequate electrical insulation and leads to considerable capacitive coupling between the coil and plasma. The non-linear electromagnetic interaction between the field of the RF coil and the plasma sheath on the inner surface of the reactor window creates a high negative DC potential in the interaction area. This negative potential accelerates the plasma ions towards the window causing erosion and sputtering of the latter whereby plasma is contaminated.

Another problem inherent in plasma processing ICP sources is a transmission line effect along the coil conductor. This effect occurs due to capacitive coupling of the induction coil to plasma and/or to grounded parts of the plasma reactor, resulting in the coil current non-uniformity along the coil wire, thus leading to the plasma azimuthal non-uniformity. The transmission line effect is an increasing problem for large RF plasma reactors when the coil wire length becomes comparable to the wavelength of the working frequency.

To reduce the capacitive coupling between the coil antenna and plasma, Faraday shields of different types are usually placed between the coil and the window. However, the shield introduces a significant additional RF power loss and significantly increases the transmission line effect, thus, deteriorating plasma uniformity. Also, the presence of the Faraday shield makes it difficult to initiate discharge in the processing reactor. That is why Faraday shields have not found wide application in commercial plasma reactors.

Another way to reduce capacitive coupling is to balance the induction antenna by feeding it with a symmetric (push-pull) RF power source [U.S. Pat. No. 5,965,034] or by connecting the second coil end to ground through a balancing capacitor [U.S. Pat. No. 6,516,742 B1]. In both cases, the coil ends acquire nearly equal but opposite phase RF potential references to ground, thus forming a virtual ground point in the middle of the coil and reducing about twice the maximal coil potential reference to ground on the both coil ends. This way of the coil RF potential reduction is widely used in commercial ICP reactors. It provides a certain benefit in capacitive coupling reduction, but still far not enough for essential reduction of the capacitive coupling and of the transmission line effect.

Induction coil antennas immersed into plasma are used in many ICP sources for ion accelerators. Furthermore, such immersed antenna coils find application in very large plasma sources for processing large plasma displays [Deguchi et al, Jpn. J. Appl. Phys. 45, 8042 (2007)]. The use of immersed internal antennas results in enhancement of inductive coupling that increases the ICP energetic efficiency. A drawback of an internal coil antenna is an increased capacitive coupling to the plasma sheath surrounding the antenna wire. The rectification of RF voltage in the sheath causes ion bombardment of the coil leading to its sputtering and plasma contamination.

The recessed antenna surrounded by cup-shaped reentrant cavity to reduce the plasma sheath interaction with the coil is disclosed in U.S. Pat. No. 5,309,063 issued to Singh. The antenna coil in this patent has a flat portion (on the cavity bottom) and a cylindrical portion on the cavity side. The cavity diameter is close to the diameter of the processing wafer. Therefore, the cylindrical portion of the antenna coil enhances peripheral plasma, thus improving plasma uniformity over the wafer processing area.

A plurality of immersed coil antennas of different configurations in recessed reentrant cavities is disclosed, e.g., in U.S. Pat. No. 6,259,209. Distribution of multiple immersed antennas over the plasma processing area allows for generation of uniform plasma over a large processing area.

Another common problem inherent in the ICP reactors of the types described above is inefficient removal of heat generated by the coils activated for excitation of plasma. Attempts have been made to solve the heat-removal problem in RF plasma reactors. For example, U.S. Pat. No. 7,137,444 issued to V. Faybishenko, et al. discloses a heat-transfer interface device for use in a range of up 320° C. working temperatures for removal of heat from RF coils used in an inductively coupled plasma reactor. The device comprises an elastomeric material filled with an electrically nonconductive and thermally conductive filler material. The elastomeric material may have recesses on the surface or the surface may be curved, e.g., on the side facing the source of heat for forming a space between the surface of the device and the mating surface of the source of heat. The elastomeric material is clamped between the heat source and heat receiver in a compressed state so that when it is expanded under the effect of an increased temperature, the material is redistributed and the recesses are flattened. The elastomeric material comprises perfluoroelastomer polymer, and the filler can be selected from boron nitride, aluminum nitride, beryllium oxide, etc. If necessary, a combined mixing-assisting and compression-set-reducing agent in the form of perfluoropolyether can be added.

U.S. Pat. No. 6,178,920 issued to Ye, et al. discloses an internal inductive antenna capable of generating plasma. In the preferred embodiments, the internal antenna of the present invention is constructed to prevent sputtering of the antenna. In one embodiment, for example, a bell shaped glass jacket with a hollow interior prevents sputtering of the conductive coil, while allowing rotation, shielding, and temperature regulation of the antenna. A main disadvantage of the antenna arrangement of this patent is that the antennas generate plasma in a certain plane which defines the plasma volume. This is associated, probably, with difficulties in removal of heat from the coils. Furthermore, such an arrangement of the coils makes it difficult to effectively transfer the RF energy into the plasma.

SUMMARY AND OBJECT OF THE INVENTION

It is an object of the present invention to provide an inductively coupled plasma reactor with a plasma source in the form of an array of ferromagnetic core antenna immersed into plasma. It is another object to provide a reactor of the aforementioned type that has increased power transfer efficiency and is free of capacitive coupling and a transmission line effect. It is another object to provide a plasma reactor that provides uniform plasma processing of large wafers and panel display. It is still a further object to provide an inductively coupled plasma reactor that is characterized by efficient removal of heat from the excitation coils.

The plasma reactor of the invention is intended for treating the surfaces of objects such as semiconductor wafers, large display panels, or the like, with plasma. The reactor comprises a sealed working chamber that may contain an object table for supporting the object to be treated in the volume of the plasma generated in the working chamber. The working chamber is also provided with a working gas supply channels and an evacuation duct for pumping the gas out from the chamber. The main part of the plasma reactor is an array of RF antenna cells which are deeply immersed into the interior of the working chamber. Each antenna cell of this array comprises a ferrite core with an inductive coil wound onto the ferrite core. The core and the coil are surrounded and sealed in a protective cap made from a dielectric material, e.g. Quartz, ceramic. Furthermore, the ferrite core is made in the form of a tubular element with a central opening and a heat conductor inserted into this opening for removal of heat from the core and the coil. The heat conductor is made from a metal or dielectric having a high coefficient of thermal conductivity, e.g., from copper, aluminum or thermo-conductive ceramic. The heat conductor is connected to a heat sink, and the protective cap is connected to the top of the reactor housing. The reactor is provided with one or more RF power sources and with one or more matching networks for matching impedance of the power source (sources) with impedance of the RF antenna cells. According to one embodiment, each antenna cell may be provided with an individual matching network (for individual power adjusting), with a single matching network coupled to a group of several antenna cells, while the antenna cells themselves can be connected to the matching network in parallel, in series, or in a combined parallel-series connection. One or several RF power sources can be used for driving different groups of antenna cells having individual or several matching networks for different antenna cell groups.

Deep immersion of the antenna cells having the above-described structure with ferromagnetic core provides high efficiency of plasma excitation, while the arrangement of the plasma cells and possibility of their individual adjustment provide high uniformity of plasma distribution and possibility of adjusting plasma parameters, such as plasma density, in a wide range.

BRIEF DESCRIPTION OF THE DRAWINGS

FIG. 5b is a structural view of the diagram of FIG. 5a.

DETAILED DESCRIPTION OF THE INVENTION

The foregoing has outlined, in general, the physical aspects of the invention and is to serve as an aid to better understanding the more complete detailed description which is to follow. In reference to such, there is to be a clear understanding that the present invention is not limited to the method or detail of construction, fabrication, material, or application of use described and illustrated herein. Any other variation of fabrication, use, or application should be considered apparent as an alternative embodiment of the present invention.

Figure 1:
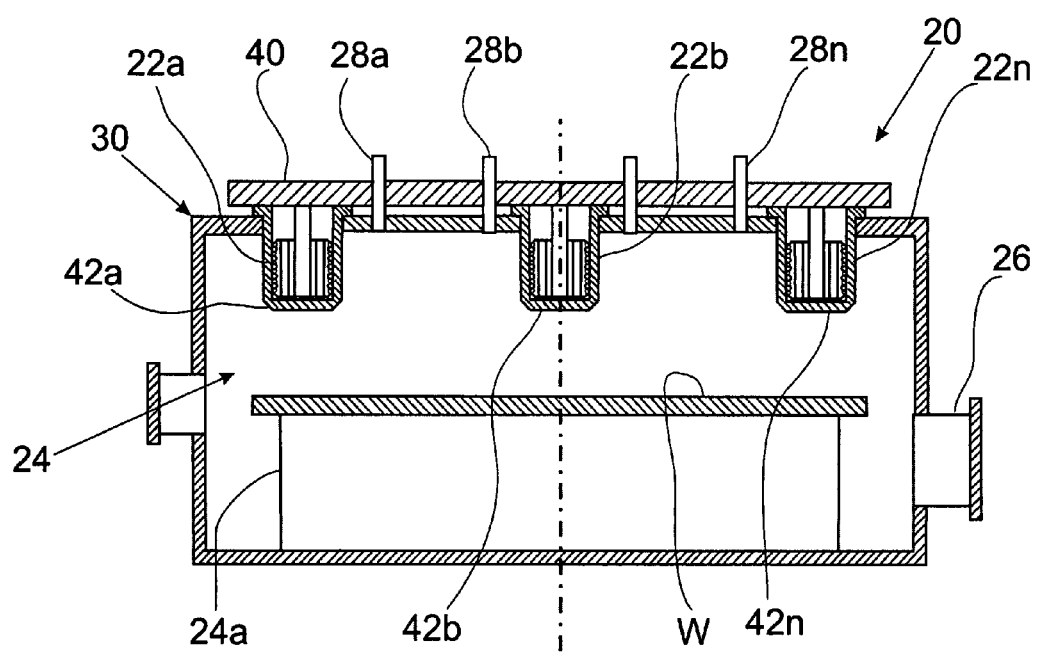
FIG. 1 is a vertical sectional view of a multiple-cell RF plasma reactor of the invention with an array of ferromagnetic RF-antenna cells completely immersed into the plasma volume generated in the working chamber of the reactor.
Figure 2:
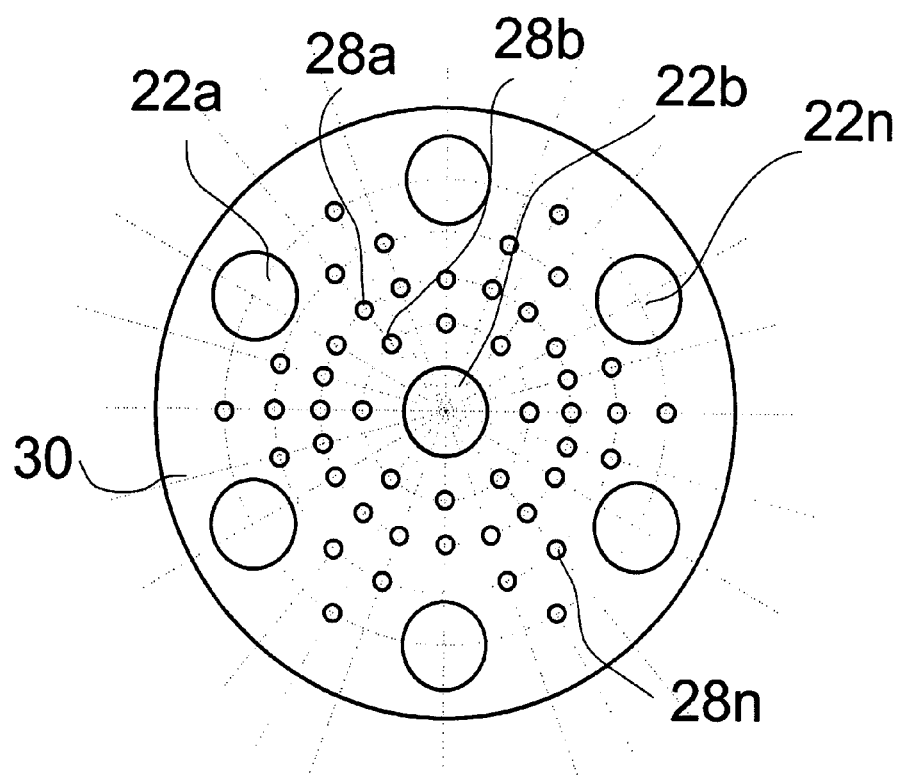
FIG. 2 is a bottom view of the reactor cover that shows arrangement of individual RF-antenna cells.

FIG. 1 is a vertical sectional view of a multiple-cell RF plasma reactor 20 with an array of ferromagnetic RF-antenna cells 22a, 22b, . . . 22n completely immersed into the plasma volume generated in the working chamber 24 of the reactor 20. FIG. 2 is a bottom view of the reactor cover that shows arrangement of individual RF-antenna cells. Reference numeral 26 shows an outlet port 26 connection to a vacuum system (not shown) for evacuation of gas from the chamber 24. The chamber is equipped with working gas injection canals 28a, 28b, . . . 28n. As can be seen from FIG. 2, the ferromagnetic RF-antenna cells 22a, 22b, . . . 22n and working gas injection canals 28a, 28b, . . . 28n are uniformly distributed over the chamber top 30. Reference numeral 24a designates an object-supporting table, and letter W designates an object to be treated, e.g., a semiconductor wafer.

Figure 3:
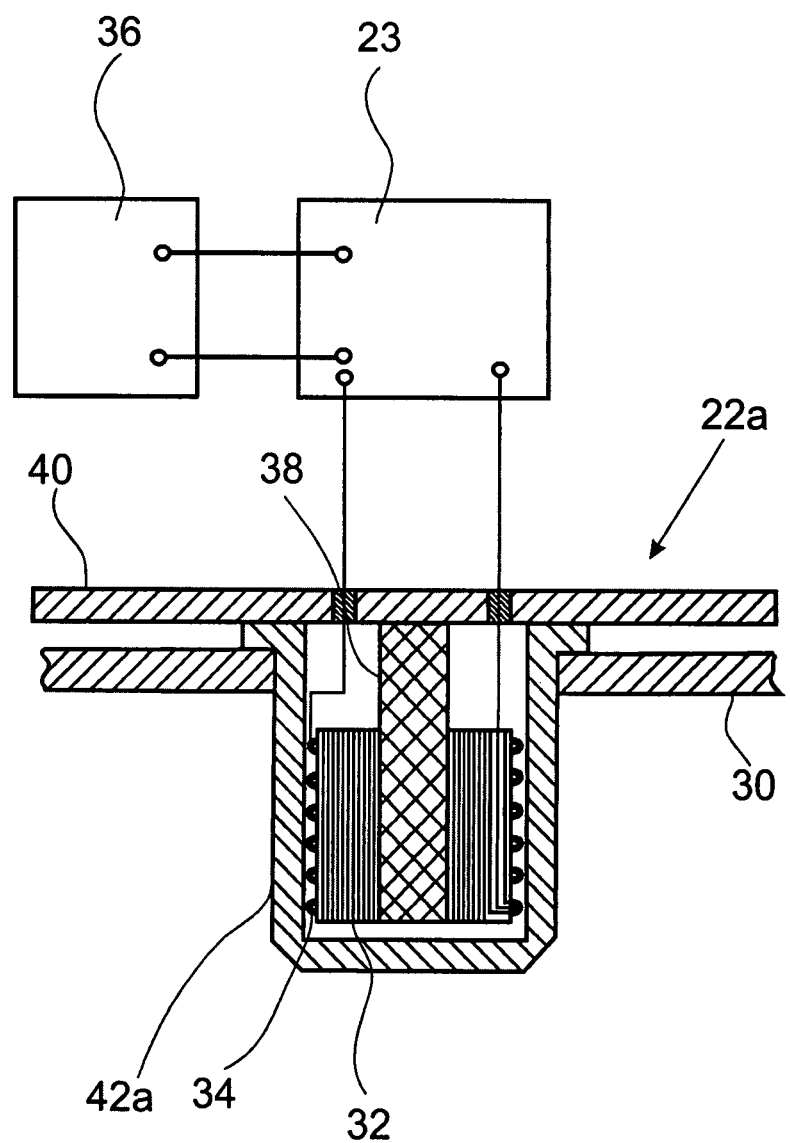
FIG. 3 is a cross sectional view of an antenna cell of the plasma source according to the present invention.

Since all ferromagnetic RF-antenna cells 22a, 22b, . . . 22n of the antenna-cell array are similar, only one of them, e.g., an RF-antenna cell 22a, will now be described in more detail. Thus, as shown in FIG. 3, which is a vertical sectional view of the RF-antenna cell 22a, the antenna cell is comprised of a tubular ferromagnetic core 32 and an induction coil 34 wound around the core 32 and connected to an RF power source 36 via a matching network 23 (FIG. 3). Inserted into the tubular core 32 of the RF-antenna cell 22a is a heat conductor 38 which has heat-transmitting contact with a heat sink 40. The cell is covered with a protective cap 42a made of a dielectric material (Quartz, ceramic, glass, silicon-carbide). The cap 42a is vacuum-sealed on the chamber top 30.

Although in FIG. 3 connection of the power source 36 to the RF-antenna cell 22a is shown in a simplified form, in an actual apparatus a common power source can be connected to each individual RF-antenna cells in a parallel or a series-connection manner for possibility of independent adjustment of each RF-antenna cell.

Figure 4A:
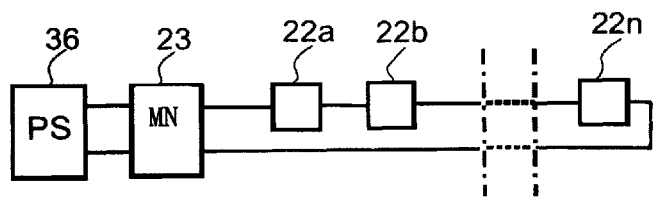
FIG. 4a is a block diagram that shows a power supply system with a common matching network, having a plurality of ferrite antenna cells connected to the matching network in series.

FIG. 4a is a block diagram that shows series connection of ferromagnetic RF-antenna cells 22a, 22b, . . . 22n to a power source 36 through a common impedance matching network 23. However, this system does not allow individual adjustment of the ferromagnetic RF-antenna cells 22a, 22b, . . . 22n.

Figure 4B:
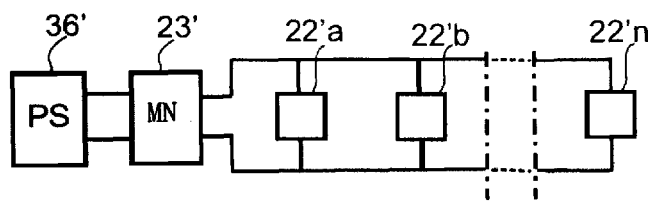
FIG. 4b is a block diagram that shows of a power supply system with a common matching network, having a plurality of ferrite antenna cells connected to the matching network in parallel.

Another version of non-adjustable connection of the ferromagnetic RF-antenna cells 22a', 22b', . . . 22n' to the power source 36' is shown in FIG. 4b where each antenna cell is connected to a power source 36' via a common matching network 23' in a parallel manner.

Figure 4C:
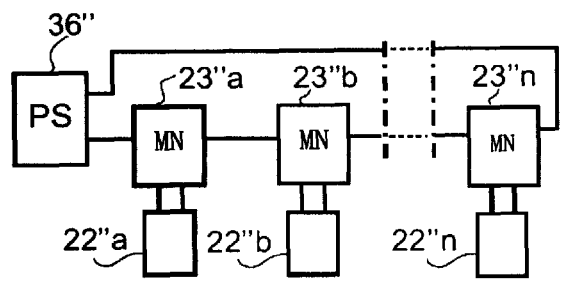
FIG. 4c is a block diagram that shows series connection of individual matching networks to an RF power source for individual power adjustment on each ferromagnetic antenna cell.

FIG. 4c is a block diagram that shows series connection of individual matching networks 23"a, 23"b, . . . 23"n to an RF power source 36" for individual power adjustment on ferromagnetic antenna cells 22"a, 22"b, . . . 22"n. This type of connection with individual RF power adjustment allows for compensation of deviations in parameters of antenna cells and the matching networks that otherwise could result in non-uniform distribution of RF power, and hence, density of plasma, over the surface of the object.

Figure 4D:
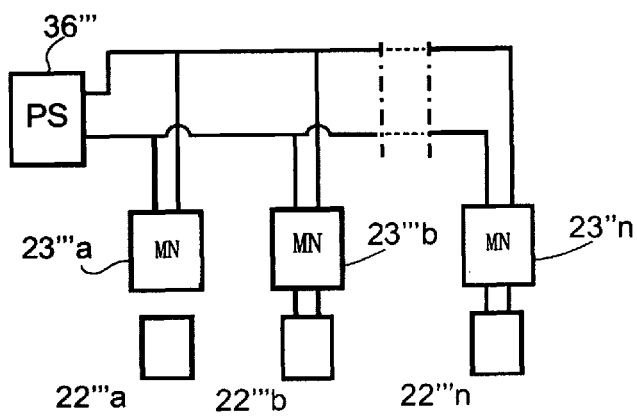
FIG. 4d is a block diagram that shows parallel connection of individual matching networks to an RF power source for individual power adjustment on each ferromagnetic antenna cell.

FIG. 4d is a block diagram that shows parallel connection of individual matching networks 23'''a, 23'''b, . . . 23'''n to an RF power source 36''' for individual power adjustment of respective ferromagnetic antenna cells 22'''a, 22'''b, . . . 22'''n.

The reference numerals 22a, 22b . . . 22'a, 22'b, etc., in general designate individual antenna cells as well as groups of the antenna cells.

The array of ferromagnetic RF-antenna cells shown in FIGS. 1 through 4 can be used to obtain large-scale plasma for uniform processing, e.g., of 300 mm wafers W (or flat panel displays) in the working chamber 24 of the apparatus 20 (FIG. 1). Independent adjustment of RF power in the peripheral antennas such as antennas 22a and 22n (FIG. 2) and in the central antenna 22b by using a power supply system shown in FIGS. 4c, and 4d, or using a plurality of power supply systems driven by multiple power sources makes it possible to effectively control plasma uniformity, both in the azimuthal and in the radial directions.

The plasma reactor 20 of the invention operates as following. First, an object to be treated, e.g., a semiconductor wafer W, is placed onto the object-supporting table 24a (FIG. 1). The working chamber 24 is evacuated though the outlet port 26 (FIG. 1), the chamber is sealed, and a working gas, e.g., argon is supplied into the chamber 24 through the working gas injection canals 28a, 28b, . . . 28n. The pressure in the working chamber is adjusted to a value required for the process, e.g., in the range $10^{-3}$ to 10 Torr.

The power supply 36 (36', 36", 36''') is energized and thus energizes the antenna cells 22a, 22b, . . . 22n (22a', 22b', . . . 22n'; 22a", 22b" . . . 22n"; or 22a''', 22b''' . . . 22n'''). Since, in principle, the antenna cells of all the embodiments generate plasma similarly, independently of the power supply method, for simplicity of the description, operation of the reactor 20 will be further considered only with reference to the arrangement of the antenna cells 22a", 22b" . . . 22n" (shown in FIG. 4c) that allows for individual adjustment of RF power on each antenna cell.

After being energized, the antenna cells 22a", 22b" . . . 22n" generate RF plasma currents around each antenna. The plasma generated near the antennas diffuses into the space formed between the protective caps 42a, 42b, . . . 42n (FIG. 1), inner walls of the working chamber 24 (FIGS. 1 and 3), and the surface of the wafer W.

Since the antenna cells 22a", 22b" . . . 22n" are deeply immersed into the cavity of the working chamber 24, they provide more efficient coupling of RF energy into the plasma. On the other hand, due to the plasma diffusion, at some distance from the antennas, i.e., near the semiconductor wafer W, the spatial plasma distribution loses the initial profile that corresponds to the antenna arrangement pattern. In other words, in the vicinity of the wafer surface, distribution of plasma becomes uniform. The aforementioned uniformity of plasma distribution over the surface of the object can be further enhances by individually adjusting power on peripheral RF antennas, such as RF antenna cells or antenna cell groups 22a and 22n, and in the central RF antenna cell 22b (FIGS. 2, 4c, and 4d).

The ferromagnetic core 32 (FIG. 3) has permeability µ that is much greater than 1 (µ>>1) and low losses of RF power on operational frequency. Since the antenna coil 34 (FIG. 3) is provided with the core 32 of a ferromagnetic material, this core intensifies electromagnetic coupling of the antenna cell 22a to plasma, which, in turn, intensifies the plasma production efficiency and plasma manageability. In addition, the core 32 increases the antenna inductance L, resulting in reduction of the coil magnetizing current $I_c \sim 1/(\omega L)$, and in significant reduction of the power loss in the antenna coil, $P_c \sim I_c^2 \cdot 1/L^2$. This leads to increase in the ICP (inductively coupled plasma) generation efficiency as compared to conventional ICP generation systems used in the plasma reactors. Reduction in the antenna power loss enables ICP to operate at small plasma density, since the minimal plasma density needed for a stable ICP operation is proportional to the ICP antenna power loss $P_c$. Increase in the coupling and in the antenna inductance (due to application of ferromagnetic core) allows for considerable reduction (up to 1-2 orders of magnitude) of ICP operating frequency comparing to conventional ICP operated at 13.56 MHz. The possibility of working on frequencies much lower than 13.56 MHz results in considerable cost reduction of the power source and matching network.

Furthermore, application of the ferromagnetic core 32 allows for considerable reduction in the antenna size to make it much smaller than in conventional ICPs of known plasma reactors. Due to the fact that the antenna cells, such as 22a, 22b, 22c, 22a', 22b', etc., have small diameters and occupy a small part of the working-chamber volume, the capacitive coupling in the ICP with internal ferromagnetic antennas of the invention is significantly reduced comparing to that in a conventional ICP source with a large coil placed on the window or recessed into working chamber of the conventional plasma reactor.

The capacitive coupling reduction, and thus reduction in RF voltage across the sheath between the antenna protective cap 42a and plasma, results from many features of the RF inductive plasma source of the invention. (1) First, it is due to a smaller surface of the inductor in comparison with the conventional one, which is achieved by introduction of the ferromagnetic core 32 (FIG. 3). (2) Second, it is due to a reduced discharge voltage along the reduced plasma current path. This reduction is achieved due to the fact that in case of the system of the invention, a single large-diameter antenna inductor coil of a conventional ICP apparatus is replaced by a plurality of small-diameter antenna inductor coils of the invention. The discharge current path diameter of each RF antenna, such as antenna 22a, 22b, . . . in the present plasma source of the antenna array, is close to the diameter of the protective cap 42a (FIG. 3), while in a conventional ICP reactor the diameter of the plasma inductance antenna or conductor is comparable to the diameter of the working chamber. This results in a significant reduction of the electromotive force that maintains plasma and, therefore, of the voltage per turn in the antenna which is much smaller than that in a conventional inductive plasma source having a coil of large diameter. (3) Third, due to ferromagnetic core, the disclosed plasma reactor 20 (FIG. 1) is able, as has been mentioned above, to operate on considerably lower frequencies than conventional ICP reactors. Reduction in the driving frequency leads to reduction and practical elimination of capacitive coupling. (4) Fourth, the further reduction in capacitive coupling can be achieved by symmetrical (push-pull) driving of the antenna coil with the opposite RF voltage phase on the coil ends.

Balancing of the antenna results in a twice-reduced RF voltage between the ends of the coil winding and the ground with formation of a virtual ground in the middle of the protective cap surface or window. This technique is widely used in today's ICP reactors and is performed using symmetric matching networks having balanced voltage output (U.S. Pat. No. 5,965,034), or using a conventional asymmetric matching network connected to one end of the coil winding with the other end of the coil winding being grounded via a blocking capacitor (U.S. Pat. No. 6,516,742 B1). In both cases, the balancing of the ICP antenna requires a balanced source or a matching network applied to the ends of the antenna coil winding.

Figure 5A:
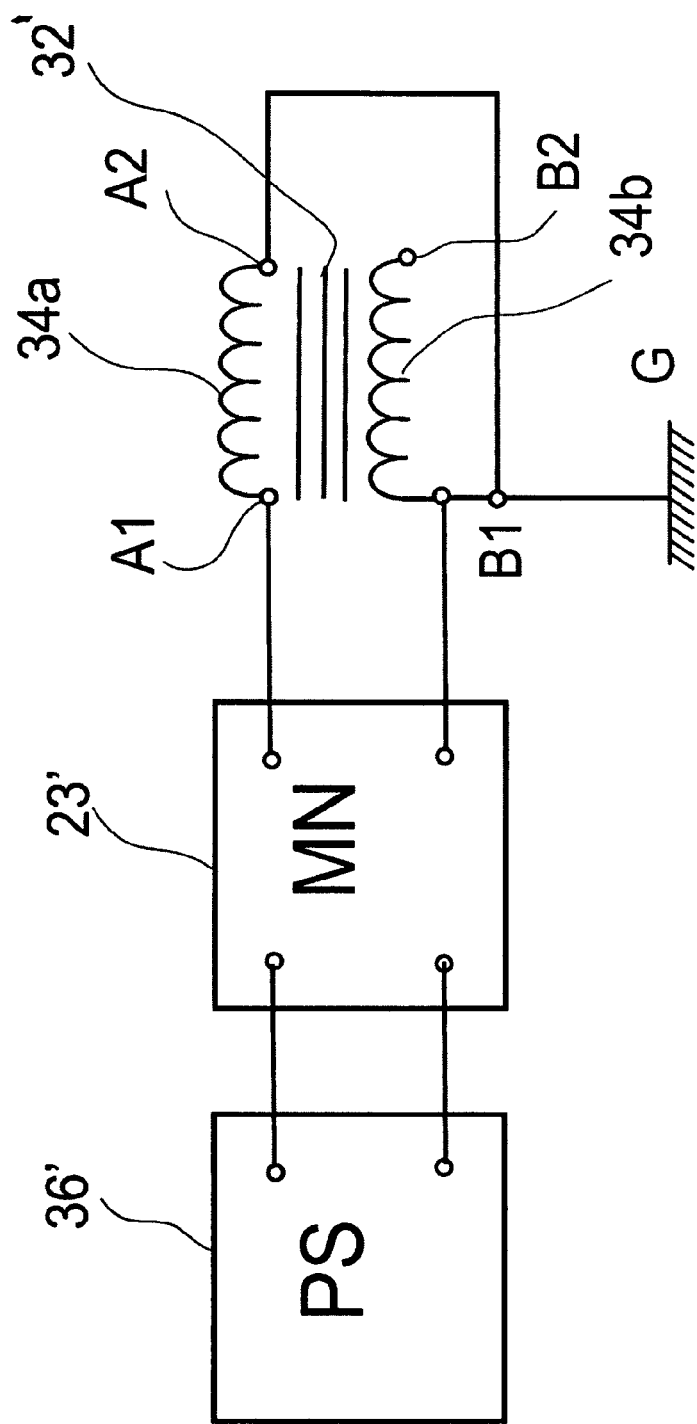
FIG. 5a is a principle diagram that shows connection of a power supply to the self-balanced antenna coil winding via a matching network.
Figure 5B:
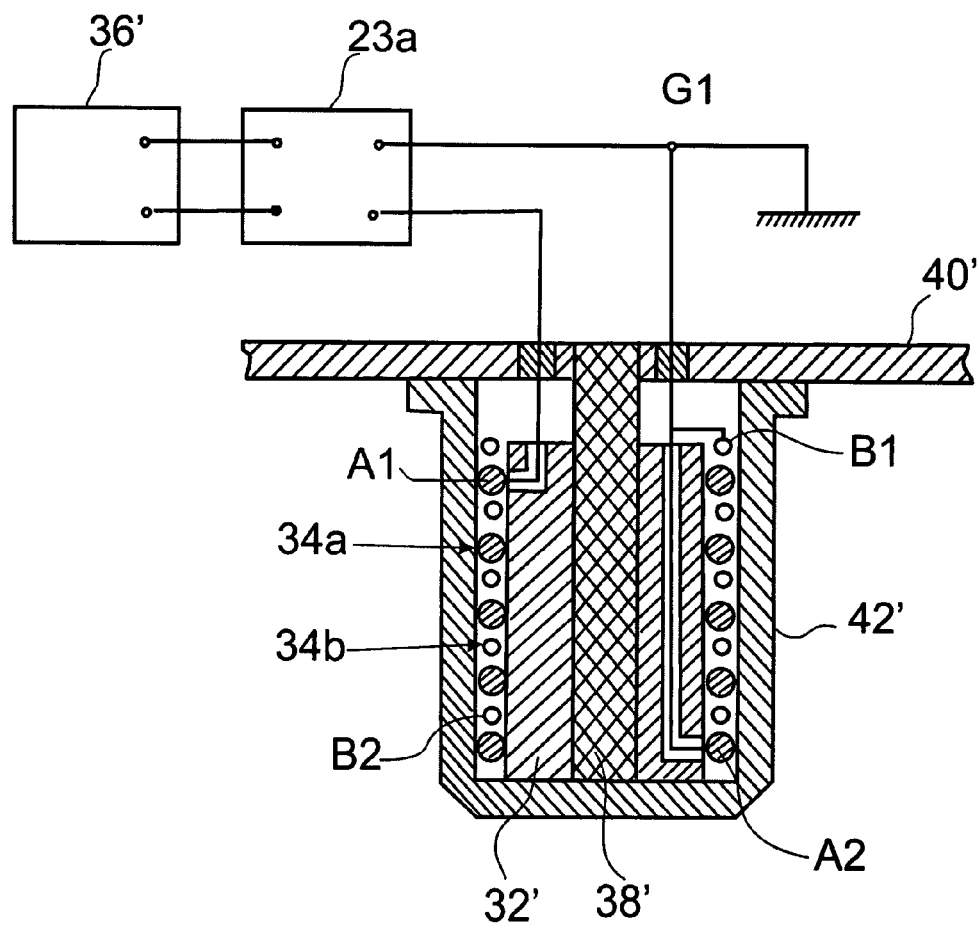

Furthermore, in addition to conventional method of balancing the antenna coil with the balanced matching network considered in the above patents, the present invention offers a self-balanced antenna of the type shown in FIGS. 5a and 5b that provides a balanced antenna operation without need in the symmetrical drive with a balanced RF matching network. In FIGS. 5a and 5b, the parts, which are similar to those shown in FIG. 3 are designated by the same reference numerals with an addition of a prime. For example, a power supply, which in FIG. 3 is designated by reference numeral 36, is designated in FIGS. 5a and 5b by reference numeral 36', etc. FIG. 5a is a principle diagram that shows connection of a power supply 36' to the self-balanced antenna coil winding 34a' via a matching network 23'. FIG. 5b is a structural view of the circuit diagram of FIG. 5a. Self-balancing of the antenna is achieved with an additional coil winding 34b wound bifilarly (parallel) to the main antenna coil 34a. The first end A1 of the main coil winding 34a is connected to the RF terminal of an asymmetric matching network 23', while its second end A2 is connected to the grounded terminal G of the matching network 23'. Due to strong coupling provided by ferromagnetic core 32' and close proximity of the two coil windings, the RF voltage induced in the second coil 34b is equal to RF voltage applied to the main coil 34a. Since the first end B1 of the second coil winding 34b is connected to the ground, the second free end B2 of the second coil winding 34b has RF potential equal in magnitude but opposite in phase to RF potential of the first end A1 of the main coil winding 34a. As a result, the antenna (comprised of two coil windings 34a and 34b) has on its ends equal RF voltages of opposite phase, thus being balanced without need of symmetric matching network or balancing capacitor. It is understood that the scheme considered above for the self-balanced antenna is also applicable to all the arrangements shown in FIGS. 1 to 4, including the antennas combined in groups.

The ferromagnetic cores 32 and 32' (FIGS. 3, 5a, and 5b) can be made of ferrite, powdered iron, or from any ferromagnetic material having large $\mu$ and low RF power losses on operating frequencies. The value of ferromagnetic material permeability $\mu$ depends on the selected operating frequency and, in the range of frequency suitable for effective operation of the ferromagnetic antenna (i.e., 0.1-50 MHz), is between 10 and 3000, with small $\mu$ for higher frequencies and large $\mu$ for low frequencies. The ferromagnetic cores 32 and 32' can be made as solid bodies or (to avoid mechanical stress caused by thermal expansion) as bodies composed of several adjacent pieces.

To prevent the antenna 22a or 22a' from overheating, the ferromagnetic core 32 (32') (FIGS. 3, 5a, and 5b) has a form of a tube and is fitted onto the rod-like heat conductor 38 (38') made of a material that has high thermal conductivity, such as copper, aluminum or high thermal conductivity ceramic. The heat conductor 38 (38') transfers the heat from the antenna coil 32 (32') and the ferromagnetic core 32 (32') to the heat sink 40 (40'). An additional antenna cooling can be provided by the protective cap 42 (42') which also is made from a non-conductive material of high thermal conductivity.

A specific feature of the present invention which was unexpectedly found is that, in spite of the fact that the heat conductor 38 (38') is made from a metal, the eddy current losses that occur in this conductor do not exceed 5% of the total antenna loss, which is negligibly low as compared to advantages of efficient removal of heat provided by such material as copper or aluminum.

It is should be noted that a great advantage of the plasma reactor 20 (FIG. 1) of the present invention that utilizes a plurality of small ferromagnetic antennas immersed deeply into the working chamber 24 over the conventional plasma reactors with a large and externally located RF antenna is that the antenna cell array of the invention practically does not radiate the RF power propagated beyond the outlines of the working chamber. This means that the plasma reactor 20 practically does not have RF radiation outside the working chamber and does not need antenna-screening means to prevent electromagnetic interference typical of conventional ICP reactors.

Figure 6:
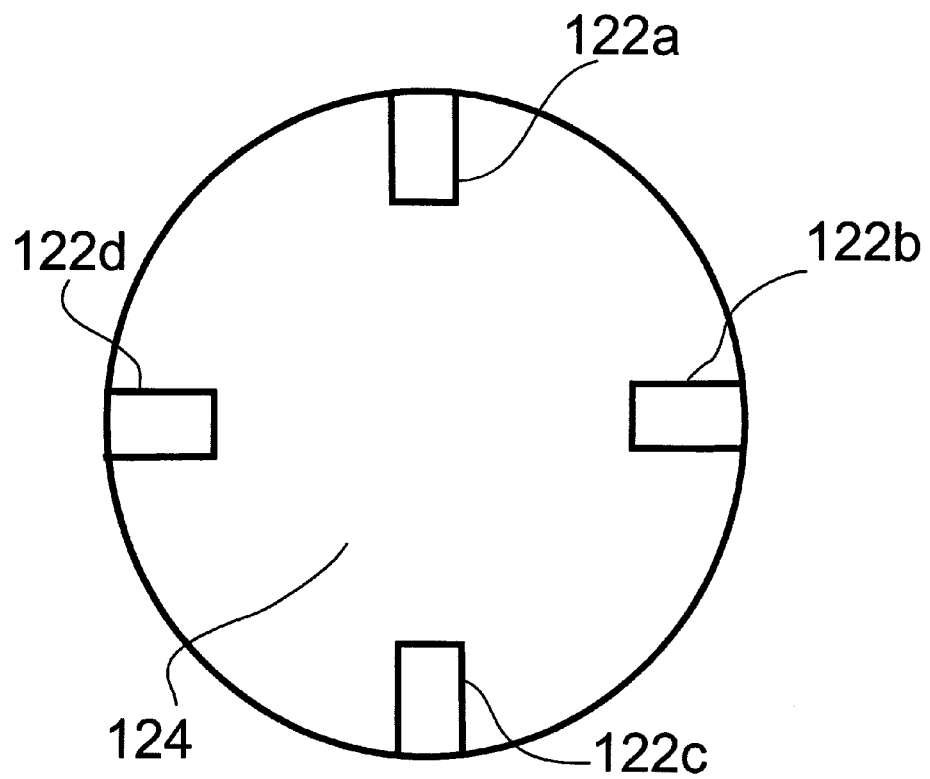
FIG. 6 is a schematic top view on a modified antenna cell arrangement where antenna cells are installed on the inner peripheral surface of the working chamber.

Another modification of the plasma source according to present invention is shown FIG. 6. Here, four antennas 122a, 122b, 122c, and 122d are installed on the inner peripheral surface 124a of the working chamber 124. Such antenna setting can involve different number of antennas and can be combined with the arrangement shown in FIGS. 1 through 5.

Thus, it can be once again underlined that utilization of a ferromagnetic antenna significantly increases performance of the inductive plasma source. It increases plasma-generation efficiency and eliminates capacitive coupling. This allows driving of the ICP source of the plasma reactor at a frequency considerably lower than 13.56 MHz which is the standard in the industry. The enhanced electromagnetic coupling and power transfer efficiency enable the invented ICP reactor to operate at considerably low RF power and plasma density than typical industrial ICP reactors, thus providing a versatile plasma processing tool able to operate in a wide range of the plasma densities. The RF plasma source of the reactor can operate efficiently in the frequency range between hundred of kHz and tens of MHz, yet having a considerably increased power factor that essentially simplifies the matching-tuning network and cost of the plasma production.

It has been shown that the invention provides an inductively coupled plasma reactor with a plasma source in the form of an array of ferromagnetic core antenna immersed into plasma. The aforementioned reactor has increased power transfer efficiency and is free of capacitive coupling and transmission line effect. The reactor of the invention provides uniform plasma processing of large wafers and panel displays and is characterized by efficient removal of heat from the excitation coils.

Although the invention has been shown and described by way of specific examples, it is understood that various changes and modifications are possible with regard to materials, shapes, and dimensions, without departure from the scope of the patent claims. For example, different number of ferromagnetic antennas and different patterns of symmetry (round, square, rectangular, hexagonal, or few rings arrays and others) can be arranged over the processing chamber of different shapes to obtain a desirable processing pattern and degree of plasma uniformity. Individual antenna cells can be immersed into the working chamber to different levels. The proposed ICP with a single or multiple ferromagnetic antennas can be used in many applications as a source of neutral plasma, a source of ions or electrons with the opened bottom part of the chamber. Instead of treatment of objects, the plasma can be used for ion or electron extraction. It is understood that the power supply systems shown in FIGS. 4a, 4b, 4c and 4d can be used as sub-systems combined into a system with multiple RF power sources which will allow individual adjustment of RF power in multiple groups of antenna cells. Independent control of the RF power transferred to different antenna groups will allow for effective control of plasma distribution over the chamber to achieve a uniform wafer processing. For example, one antenna group can be placed in the center of chamber top while antennas of the other group can be distributed over the chamber periphery.

The invention claimed is:

1. A plasma reactor with inductive excitation of plasma, comprising:
    a working chamber that can be sealed and evacuated and that is provided with working gas supply channels, and a working gas outlet port, the working chamber comprising a sidewall and a chamber top;
    a plurality of antenna cells immersed into the working chamber; and
    an RF power source connected to the antenna cells for generation of plasma in the working chamber;
    each antenna cell of the plurality of antenna cells comprising:
        a ferromagnetic core;
        at least one inductive coil wound onto the ferromagnetic core;
        a cap made from a dielectric material that sealingly covers the ferromagnetic core and the inductive coil, the cap being connected to one of the working chamber sidewall or chamber top;
    wherein the ferromagnetic core of the antenna cell has a tubular shape with a central opening, the antenna cell comprising a heat conductor made from a material of high thermal conductivity inserted into the central opening, wherein the heat conductor is in contact with a heat sink, the heat sink being spaced apart from both the working chamber sidewall and the chamber top; the heat sink being a separate structure from the cap, and the heat sink being in thermal communication with one of the working chamber sidewall or chamber top.

2. The plasma reactor of claim 1, wherein the cap is made from a non-electrically conductive material of high thermal conductivity.

3. The plasma reactor of claim 1, wherein the heat conductor of high thermal conductivity is made of a metal.

4. The plasma reactor of claim 1, wherein each antenna cell is provided with an individual matching network for matching an impedance of each antenna cell with an impedance of the RF power source.

5. The plasma reactor of claim 4, wherein each antenna cell of the plurality of antenna cells is connected to the RF power source via a parallel connection or a serial connection.

6. The plasma reactor of claim 4, wherein a first end of the at least one inductive coil in each respective antenna cell is connected to a first balanced output of a matching network, a second end of the at least one inductive coil in the respective antenna cell is connected to a second balanced output of the matching network, wherein a first RF potential is applied to the first end of the at least one inductive coil in the respective antenna cell, a second RF potential is applied to the second end of the at least one inductive coil in the respective antenna cell, the first and second RF potentials being approximately equal and opposite in phase.

7. The plasma reactor of claim 4, wherein each antenna cell comprises an additional coil bifilarly wound with the inductive coil around the ferromagnetic core, the inductive coil and the additional coil each having a first end at a first end of the bifilar winding and a second end at a second end of the bifilar winding.

8. The plasma reactor of claim 7, wherein the first end of the inductive coil in each respective antenna cell is connected to an unbalanced output of a matching network, the first end of the additional coil and the second end of the conductive coil are connected to a ground of the matching network, the second end of the addition coil is coupled to an unbalanced output of the matching network, the RF potential applied to the first end of the inductive coil being equal in magnitude and opposite in phase to a second RP potential applied to the second end of the additional coil.

9. The plasma reactor of claim 1, wherein the plurality of antenna cells are coupled to the RF power source through a common impedance matching network.

10. The plasma reactor of claim 9, wherein the plurality of antenna cells is connected to the RF power source via a parallel connection or a serial connection.

11. The plasma reactor of claim 9, wherein a first end of the at least one inductive coil in each respective antenna cell is connected to a first balanced output of a matching network, a second end of the at least one inductive coil in the respective antenna cell is connected to a second balanced output of the matching network, wherein a first RF potential is applied to the first end of the at least one inductive coil in the respective antenna cell, a second RF potential is applied to the second end of the at least one inductive coil in the respective antenna cell, the first and second RF potentials being approximately equal and opposite in phase.

12. The plasma reactor of claim 9, wherein each antenna cell comprises an additional coil bifilarly wound with the inductive coil around the ferromagnetic core, the inductive coil and the additional coil each having a first end at a first end of the bifilar winding and a second end at a second end of the bifilar winding.

13. The plasma reactor of claim 12, wherein the first end of the inductive coil in each respective antenna cell is connected to an unbalanced output of a matching network, the first end of the additional coil and the second end of the conductive coil are connected to a ground of the matching network, the second end of the addition coil is coupled to an unbalanced output of the matching network, the RF potential applied to the first end of the inductive coil being equal in magnitude and opposite in phase to a second RF potential applied to the second end of the additional coil.

\* \* \* \* \*